(12) United States Patent
Ono et al.

(10) Patent No.: US 8,440,513 B2
(45) Date of Patent: May 14, 2013

(54) METHOD OF SEMICONDUCTOR PROCESSING

(75) Inventors: Tetsuo Ono, Iruma (JP); Go Saito, Hikari (JP)

(73) Assignee: Hitachi High-Technologies Corporation, Tokyo (JP)

(*) Notice: Subject to any disclaimer, the term of this patent is extended or adjusted under 35 U.S.C. 154(b) by 1067 days.

(21) Appl. No.: 12/198,222

(22) Filed: Aug. 26, 2008

(65) Prior Publication Data

US 2009/0325388 A1 Dec. 31, 2009

(30) Foreign Application Priority Data

Jun. 30, 2008 (JP) ................................. 2008-170629

(51) Int. Cl.
*H01L 21/302* (2006.01)
*H01L 21/3065* (2006.01)

(52) U.S. Cl.
USPC ........... 438/170; 438/720; 438/722; 438/736; 438/737

(58) Field of Classification Search .................. None
See application file for complete search history.

(56) References Cited

U.S. PATENT DOCUMENTS

| | | | | |
|---|---|---|---|---|
| 5,962,346 A * | 10/1999 | Shue et al. | ..................... | 438/720 |
| 6,593,244 B1 * | 7/2003 | Wang et al. | ..................... | 438/706 |
| 6,638,875 B2 * | 10/2003 | Han et al. | ..................... | 438/725 |
| 6,762,130 B2 * | 7/2004 | Laaksonen et al. | ........... | 438/706 |
| 6,951,823 B2 * | 10/2005 | Waldfried et al. | ........... | 438/710 |
| 7,319,074 B2 * | 1/2008 | Chou et al. | ..................... | 438/717 |
| 7,381,651 B2 * | 6/2008 | Sakthivel et al. | ............. | 438/706 |
| 7,449,416 B2 * | 11/2008 | Becknell et al. | .............. | 438/725 |
| 7,642,195 B2 * | 1/2010 | Yeh | ................ | 438/725 |
| 7,691,754 B2 * | 4/2010 | Liu | ................ | 438/740 |
| 7,704,888 B2 * | 4/2010 | Carter | .......................... | 438/710 |
| 7,799,685 B2 * | 9/2010 | Savas et al. | ................... | 438/689 |
| 2005/0208756 A1 | 9/2005 | Matsushita et al. | | |
| 2007/0037101 A1 * | 2/2007 | Morioka | ....................... | 430/313 |
| 2007/0178637 A1 * | 8/2007 | Jung et al. | ..................... | 438/216 |

FOREIGN PATENT DOCUMENTS

| | | |
|---|---|---|
| JP | 2001-110775 | 4/2001 |
| JP | 2005-229130 | 8/2005 |
| JP | 2005-268312 | 9/2005 |
| KR | 10-2007-0078923 | 8/2007 |

\* cited by examiner

*Primary Examiner* — Anita Alanko
(74) *Attorney, Agent, or Firm* — Antonelli, Terry, Stout & Kraus, LLP.

(57) ABSTRACT

In a semiconductor that has a structure in which a work function controlling metal conductor is provided on a high dielectric insulation film, fine processing is performed without deteriorating a device. In a method of semiconductor processing, in which the semiconductor has an insulation film containing Hf or Zr formed on a semiconductor substrate and a conductor film containing Ti or Ta or Ru formed on an insulation film, and the conductor film is processed by using a resist formed on the conductor film under a plasma atmosphere, the resist is removed under the plasma atmosphere of gas that contains hydrogen and does not contain oxygen.

5 Claims, 5 Drawing Sheets

WAFER BIAS 0W

WAFER BIAS 50W

METHOD OF SEMICONDUCTOR PROCESSING

BACKGROUND OF THE INVENTION

1. Field of the Invention

The present invention relates to a method of semiconductor processing, and more particularly, to a method of semiconductor processing for processing the semiconductor that has a structure, in which metal is provided on a high dielectric insulation film.

2. Description of the Related Art

For instance, in Japanese Patent Application Laid-Open Publication No. 2005-268312, in respects to the removal of resist that is formed on an insulation film with a low dielectricity that is called low-k film used for the interlayer insulation film of the semiconductor device, a method for using a neutral radical of a hydrogen atom or a hydrogen molecule that is extracted from a plasma of mixed gas that includes hydrogen and rare gas is disclosed. In Japanese Patent Application Laid-Open Publication No. 2005-268312, since the dielectricity is increased by deterioration such as the oxidation of the low-k film by using a method of removing resist using a general oxygen plasma, a method of removing the resist while oxygen is not used is described. In addition, in this document, a technology for increasing the temperature of the substrate from 200° C. to 400° C. to increase the removing rate of the resist, and a technology for irradiating the NH3 plasma or the CF4 plasma to remove a modified layer on the surface of resist have been disclosed.

In Japanese Patent Application Laid-Open Publication No. 2005-229130, a semiconductor device having a metal gate provided with a high melting point metal electrode such as W, a washing method that removes pollution while preventing deterioration in W is disclosed. In Japanese Patent Application Laid-Open Publication No. 2005-229130, in an atmosphere that includes hydrogen and steam, a technology for heat oxidizing the wafer in atmosphere includes hydrogen and steam and washing the wafer by a solution that does not include hydrogen peroxide is disclosed. In this method, since the W layer is not oxidized, the W oxide layer is not removed by the washing. In addition, the use of oxygen plasma to remove the resist after the dry etching of the semiconductor device is described in 0055, 0056 paragraphs of this document.

SUMMARY OF THE INVENTION

As shown in Japanese Patent Application Laid-Open Publication No. 2005-229130, in the related art, the oxygen plasma is used for removing resist from the device of the metal gate structure. However, if the device is made fine and the width of the processing line is not more than 65 nm, there are problems in that sidewalls of metal electrodes such as Ti, Ta, and Ru are oxidized by the oxygen when used to remove the resist, the resistance increases, and the device is deteriorated.

In the case of when the width of the processing line of the device is large, since the ratio of it in respects to the whole of the thickness of the oxide layer in the above-mentioned sidewall is small, an increase in resistance does not become a problem. Therefore, in the related art, a solution methodology concerning this respect is not mentioned.

The present invention has been made keeping in mind the problems occurring in the related art, and provides a processing method that is useful for fine processing in respects to a semiconductor that has a structure including a metal conductor formed on a high dielectric insulation film.

According to an embodiment of the present invention, there is provided the following means.

In a method of semiconductor processing, in which the semiconductor has an insulation film containing Hf or Zr formed on the semiconductor substrate and a conductor film containing Ti or Ta or Ru formed on the insulation film, and the conductor film is processed by using a resist formed on the conductor film under a plasma atmosphere, the resist is removed under the plasma atmosphere of gas that contains hydrogen and does not contain oxygen.

With the above configuration, the present invention can perform fine processing while a device is not deteriorated in a semiconductor that has a structure including a metal conductor formed on a high dielectric insulation film.

BRIEF DESCRIPTION OF THE DRAWINGS

Embodiments of the present invention will be described in detail based on the following figures, wherein.

DETAILED DESCRIPTION OF THE PREFERRED EMBODIMENTS

Hereinafter, the preferable embodiments of the present invention will be described with reference to the accompanying drawings.

Figure 1A:
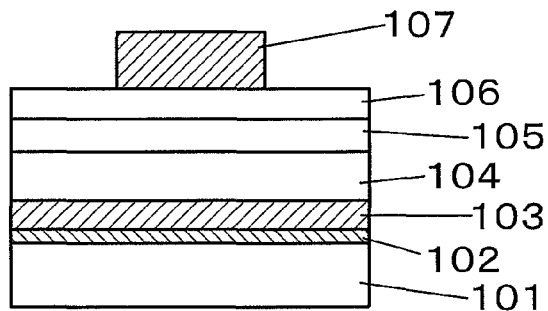
FIGS. 1A to 1D are views that illustrate a method of semiconductor processing according to a first embodiment.

FIGS. 1A to 1D are views that illustrate a method of semiconductor processing according to a first embodiment, and FIG. 1A is a cross-sectional view of the semiconductor device that will be processed. As shown in FIG. 1A, the semiconductor device has a Si substrate 101, HfSiON films 102 that are sequentially formed as a high dielectric insulation film on the Si substrate 101, a TiN film 103 that is used as the work function controlling metal conductor film, a W film 104 that is used as an electrode material, an SiN film 105 that is used as a cap, and an antireflection film 106. Here, an FET having high-k film/metal gate structure can be formed by using the high dielectric HfSiON film 102 as a gate insulation film of the FET (high-k film), while using the TiN film 103 as the metal gate.

The thickness of each of the films is as follows. The thickness of the HfSiON film 102 is 2 nm, the thickness of the TiN film 103 is 10 nm, the thickness of the W film 104 is 50 nm, the thickness of the SiN film 105 is 50 nm, the thickness of the antireflection film 106 is 80 nm, and the thickness of the resist 107 is 200 nm.

FIG. 1A shows the initialization state of the processing, and the resist 107 that is patterned by the lithography is disposed in the uppermost layer.

Figure 1C:
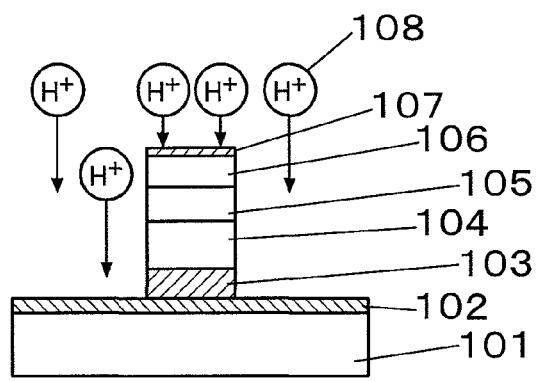
Figure 1B:
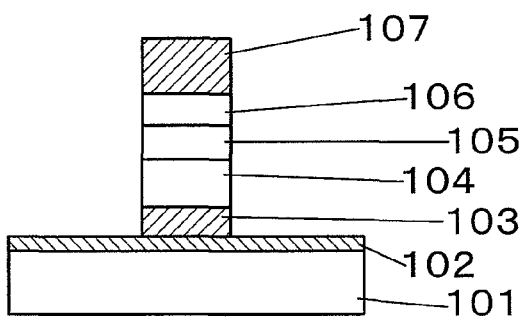

FIG. 1B shows the shape after dry etching is performed in respects to the antireflection film 106, the SiN film 105, the W film 104, and the TiN film 103 by using the thin resist 107 after the process for trimming the resist 107 to make the line width thin is performed.

The trimming is performed under the plasma atmosphere of the Ar/O2 mixed gas, and the plasma of the mixed gas of SF6/CHF3/Ar is used for etching the SiN film 105. In addition, for etching the W film 104 and the TiN, SF6 gas is supplied at a flow rate of 5 ml/minute, Cl2 gas is supplied at a flow rate of 20 ml/minute, CHF3 gas is supplied at a flow rate of 40 ml/minute, and N2 gas was supplied at a flow rate of 100 ml/minute, and the plasma at pressure of 1 Pa is used.

FIG. 1C shows the resist removing process by using hydrogen plasma. Here, the temperature of the substrate is controlled to 30° C., H2 gas is supplied at a flow rate of 50 ml/minute, N2 gas is supplied at a flow rate of 50 ml/minute, and the plasma at a pressure of 1 Pa is used. By this process, the resist 107 and the antireflection film 106 can be removed.

Figure 1D:
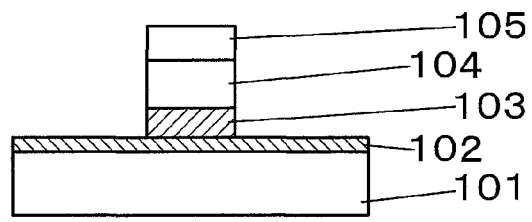

FIG. 1D is a view that illustrates the shape after the removal of the resist is finished. Further, in addition to TiN, TaN, TaSiN, Ru, RuO, and the like may be used as the work function controlling metal conductor film 103.

Figure 2:
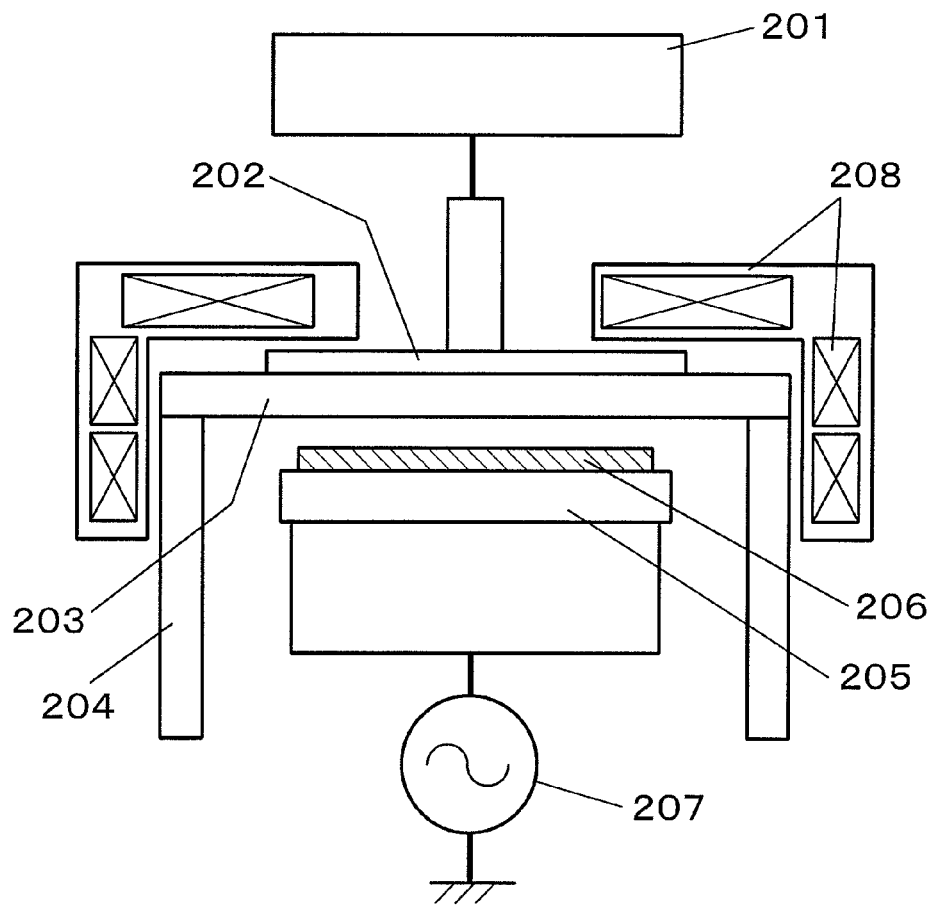
FIG. 2 is a view that illustrates a processing device (plasma etching device) that processes the semiconductor device.

FIG. 2 is a view that illustrates a processing apparatus (plasma etching apparatus) that processes the semiconductor device. This device is called an electron cyclotron resonance (ECR) method, and an electromagnetic wave that is emitted from a plasma power supply 201 is introduced into a vacuum chamber 204 (decompression processing chamber) through an antenna 202 and a window 203 where electromagnetic waves such as quartz are penetrated. In the chamber 204, the etching gas is retained at constant pressure, and etching or the resist removal operation is performed by generating the gas plasma using the above-mentioned electromagnetic wave, and entering the reactive ion onto the wafer 206.

A bias power supply 207 to accelerate an incidence ion is connected to the specimen support 205 that retains the wafer 206. In this device, a magnetic field is generated by an electromagnetic coil 208 in the chamber 204. If the magnetic field strength is set so that an electronic cyclotron frequency in the plasma corresponds with the frequency of the plasma power supply 201, since the power is efficiently absorbed by the plasma, a high plasma density can be maintained at a low pressure. The magnetic field strength can be set so as to cause ECR by changing the current value provided into the electromagnetic coil 208. In addition, the processing device that is used for etching or the resist removal is not limited to the ECR method, and, for instance, an inductive coupling plasma (ICP) processing device and the like may be used.

Figure 3:
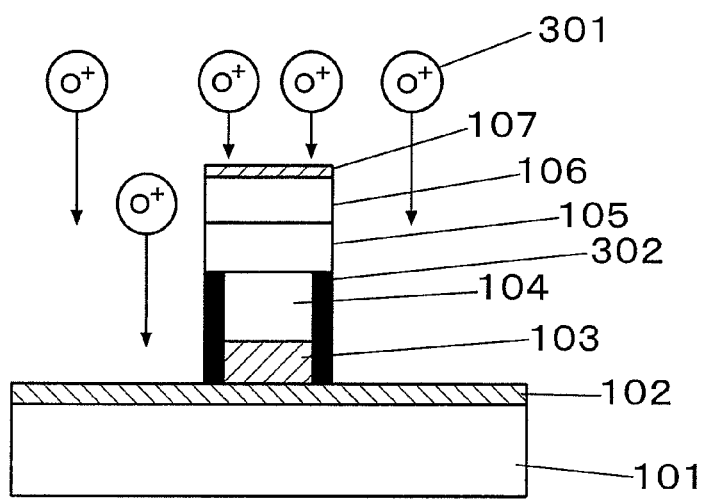
FIG. 3 is a view that illustrates an appearance of the resist removal when an oxygen plasma is used.
Figure 4:
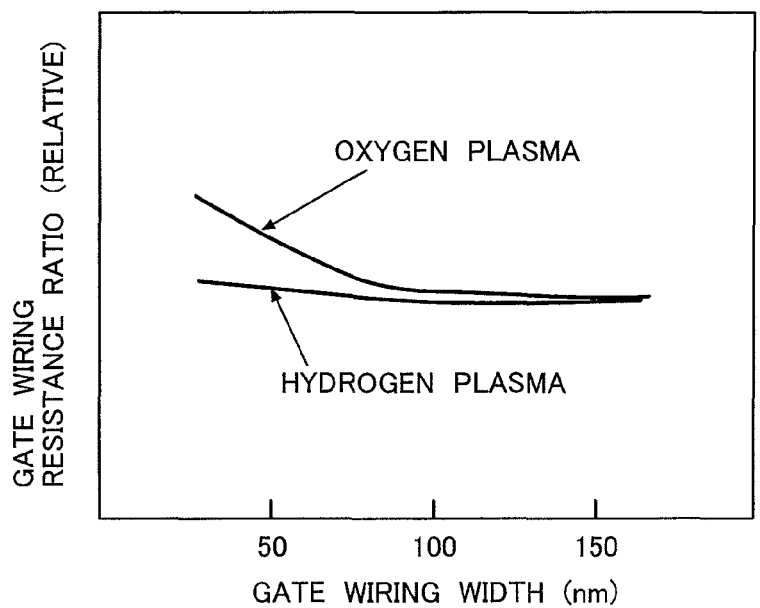
FIG. 4 is a view that compares resistance ratios of gate wirings after the resist is removed by using the hydrogen plasma and the oxygen plasma.

FIGS. 3 and 4 are views that illustrate the effects of the present invention. FIG. 3 is a view that illustrates an appearance of the resist removal by an oxygen plasma that is a related art, and FIG. 4 is a view that compares resistance ratios (resistance for each unit of a cross-sectional area) of gate wirings after the resist is removed by using hydrogen plasma and oxygen plasma. In addition, in the drawings, the same parts as those shown in FIGS. 1A to 1D, use the same reference numerals and the description thereof is omitted.

As shown in FIG. 3, in the resist removal that uses the oxygen plasma 301, an oxide layer 302 is formed on a sidewall that is exposed to a metallic conductor film, that is, the plasma of the W film 104 and the TiN film 103. Therefore, if the width of the gate wirings is not more than 100 nm, and in particular, not more than 65 nm, as shown in FIG. 4, the influence of the oxide layer 302 is increased, and the resistance ratio of the wiring is increased.

On the other hand, if hydrogen plasma is used in place of oxygen plasma, since a metallic conductor film is not oxidized, the wiring resistance ratio is barely increased. In addition, if the wiring resistance is increased, the power consumption of the device is increased, and the high speed operation of the device is hindered.

The removal rate of the resist is increased due to the high temperature of the substrate, but in consideration of the quality of the metal material, it is preferable that the temperature of the substrate is not more than 200° C. In addition, it is more preferable that the temperature of the substrate is in the range of 30 to 100° C.

As described above, in the removal of the resist of the semiconductor device having the high-k film and the metal material (metal gate), the deterioration of the device (metal gate) can be prevented by using hydrogen plasma.

Figure 5:
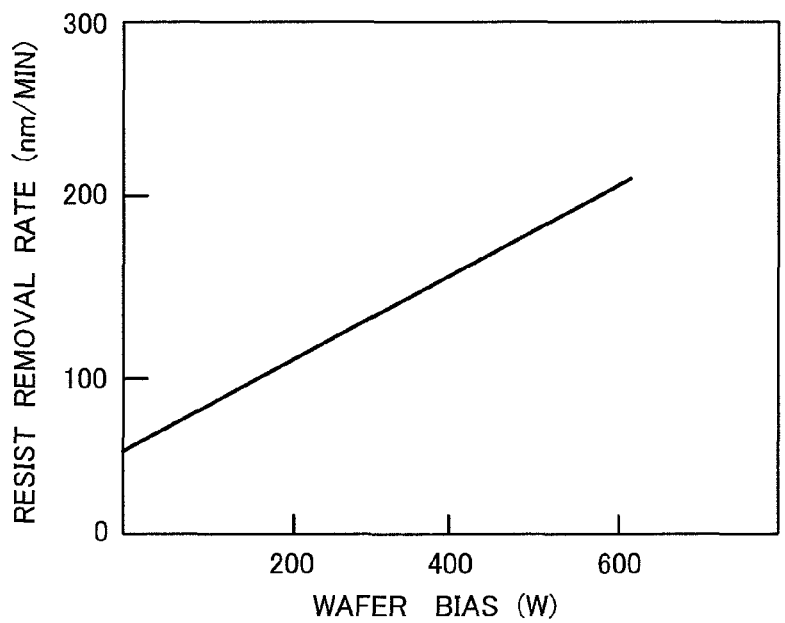
FIG. 5 is a view that illustrates a second embodiment.
Figure 6A:
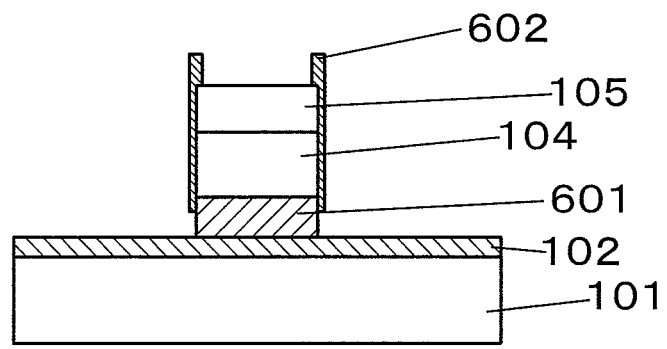
FIGS. 6A and 6B are views that illustrate a second embodiment.
Figure 6B:
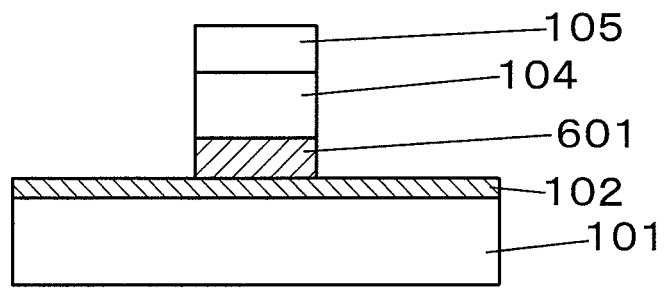

FIGS. 5, 6A and 6B are views that illustrate the second embodiment. In this example, in the removal of the resist by hydrogen plasma, the processing rate is improved by applying the bias to the silicon substrate (wafer).

As shown in FIG. 2, a plasma etching apparatus has a bias power supply 207 to accelerate the ion that is irradiated onto the wafer 206. The frequency of the bias power supply 207 is a high frequency in the range of 400 KHz to 20 MHz. The removal rate of the resist can be improved by accelerating the ion that is irradiated onto the wafer 206 by this bias power supply.

FIG. 5 is a view that illustrates the relation between the wafer bias power (400 KHz) and the removal rate of the resist in the mixed gas plasma (1 Pa) of H2/Ar. It can be seen that the removal rate of the resist is increased as the bias power is increased.

FIGS. 6A and 6B are views that illustrate the removal property of the deposit in the gate electrode sidewall by the presence of the wafer bias power, FIG. 6A illustrates the case of when the wafer bias is not applied, and FIG. 6B illustrates the case of when the wafer bias is applied (50 W).

In the case of when a material has relatively low vapor pressure of compounds with halogens, such as TaSiN, is selected as a metal that forms the metal gate 601, the deposit 602 is generated on the electrode sidewall while etching is performed.

If the removal of the resist is performed without applying the wafer bias, as shown in FIG. 6A, after the resist is removed, the deposit 602 remains. The deposit 602 can be removed by applying 50 W as a wafer bias as shown in FIG. 6B. This is because the degradative reaction of deposit 602 being promoted by the energy of the accelerated ion and the deposit 602 is removed by the physical sputter.

In addition, the ion energy is almost proportional to the amplitude Vpp (V) of the bias voltage of the wafer. In an example shown in FIG. 5, in the case of when the bias power is 50 W, Vpp becomes 350 V, and in the case of when the bias power is 100 W, Vpp becomes 600 V.

The removal rate of the resist is increased by the high Vpp, but when Vpp is increased, the HfSiON film 102 that is the gate insulation film and the Si substrate 101 that is a lower layer thereof are damaged by irradiation of the ion. In consideration of the measurement results of the properties of the device and the removal rate of the resist, it is preferable that the amplitude Vpp of the bias voltage is not more than 1500 V. In addition, it is more preferable that the amplitude Vpp of the bias voltage is in the range of 500 V (80 W) to 100 V (15 W).

Figure 7:
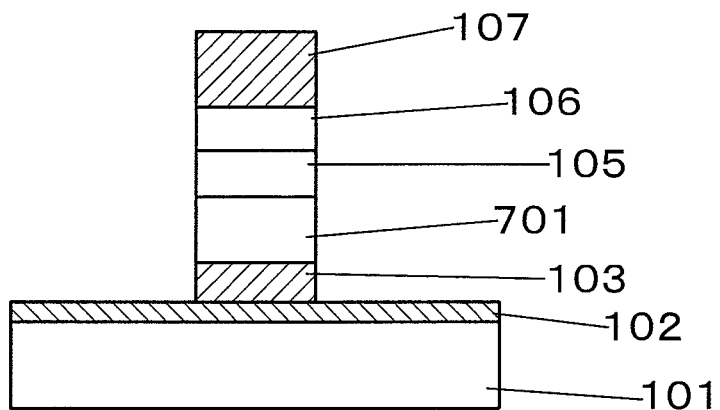
FIG. 7 is a view that illustrates a third embodiment.

FIG. 7 is a view that illustrates a third embodiment. In the example of FIG. 7, as a gate electrode, an electrode that includes a poly-Si membrane 701 that is deposited on the metal gate metallic TiN film 107 is used. According to a structure of the electrode, since it is difficult to oxidize the poly-Si membrane 701 as compared to W as shown in FIGS. 1A to 1D, the deterioration by the oxygen plasma is comparatively small, but since the metal portion of the TiN film 107 is already oxidized, which causes the deterioration of the device. Therefore, in this structure, there is an effect in which the removal of the resist with the hydrogen plasma suppresses the characteristic degradation of the device.

Figure 8:
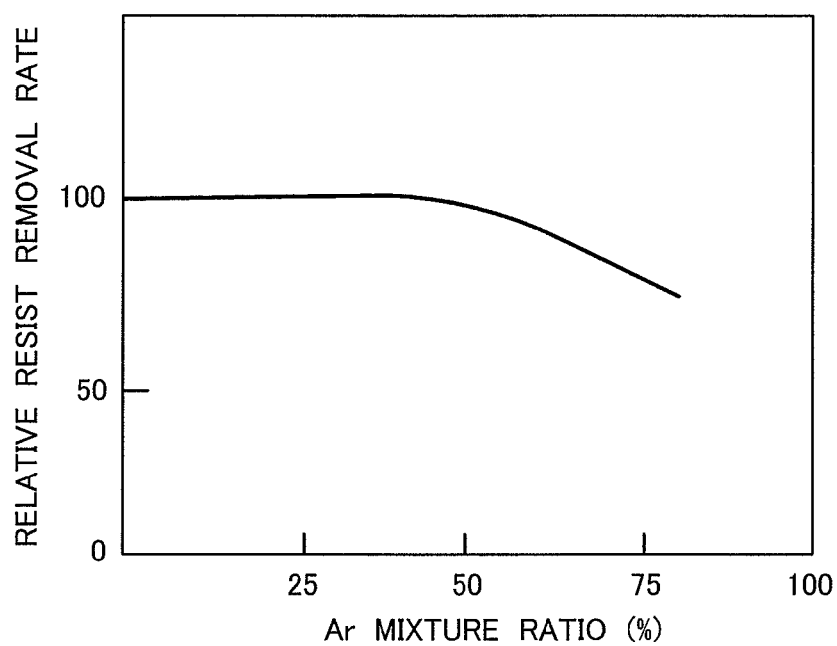
FIG. 8 is a view that illustrates the relationship between the Ar ratio and the removal rate of resist in the mixed gas.

FIG. 8 is a view that illustrates the relation between the Ar ratio and the removal rate of resist in the mixed gas of H2/Ar that is used in the etching.

In order to remove the resist without using oxygen, there is a method that is described in the above-mentioned Japanese Patent Application Laid-Open Publication No. 2005-268312, that is, a method for using neutral radicals of the hydrogen atom or the hydrogen molecule. However, this method has the lower resist removal ability as compared to the method for using the plasma, and in the removal of the resist after the metal gate is processed, the residue easily remains.

In addition, as the gas that is used for the resist removal, in addition to H2, H2/N2 and H2/rare gas, the same effect is obtained by using the plasma of the gas including hydrogen such as NH3. In addition, the mixing ratio when hydrogen and N2 or a rare gas is mixed is mainly a dilution of hydrogen in consideration of safety.

As described above, FIG. 8 is a view that illustrates the relation between the Ar ratio and the removal rate of resist in the mixed gas of H2/Ar, and if the ratio of Ar exceeds 50%, the removal rate of resist is reduced. Therefore, it is preferable that the mixing ratio of the rare gas or N2 is not more than 50%.

In addition, if the gas including halogens such as CF4, CHF3, NF3, and SF6 is mixed with the gas including hydrogen, the removal property of the deposit that includes metal is improved. If the mixing ratio of the halogen gas is increased, which may cause etching of metals or poly Si, it is preferable that the mixing ratio is not more than 30%. In addition, it is more preferable that the mixing ratio is in the range of 5 to 10%.

As described above, according to the embodiment of the present invention, a processing method that is appropriate for the fine processing of the semiconductor device having the structure with a high-k/metal gate that is proposed for the speed-up of the transistor can be provided.

In particular, in the production of the semiconductor device that is provided with the gate electrode including the deposited metal to control work functions such as TiN, TaN, Ru or RuO formed on the gate insulation film with high dielectricity such as HfO or ZrO, which are called high-k film, being deposited thereon, in respects to the removal of the resist after dry etching is performed, the plasma of the gas that contains hydrogen but does not contain oxygen may be used to remove the resist while the gate electrode including the deposited metal such as TiN, TaN, Ru or RuO does not become oxidized.

What is claimed is:

1. A method of semiconductor processing, in which a semiconductor substrate of the semiconductor has thereon an insulation film containing Hf or Zr, a conductor film, that is formed on the insulation film, containing Ti or Ta or Ru, a cap formed on the conductor film, and a resist formed on the cap, the semiconductor substrate being processed by using a plasma, the method comprising:

processing the conductor film having the cap and the resist thereon by using the plasma, such that a width of the processed conductor film is not more than 65 nm; and after processing the conductor film, removing the resist by using a plasma of gas that contains hydrogen and does not contain oxygen, in order to block oxidation of a sidewall of the processed conductor film.

2. The method of semiconductor processing according to claim 1, wherein the gas that contains hydrogen and does not contain oxygen is any one of H2 gas, mixed gas of H2 gas and a rare gas, NH3 gas, and a mixed gas of H2 gas and N2 gas.

3. The method of semiconductor processing according to claim 1, wherein the gas containing hydrogen and not containing oxygen is any one of H2 gas, a mixed gas of H2 gas and a rare gas, NH3 gas, and a mixed gas of H2 gas, and N2 gas, and mixed with CF4 gas, CHF3 gas, SF6 gas, or NF3 gas.

4. The method of semiconductor processing according to claim 1, wherein the conductor film includes a work function controlling metal, and an electrode layer that includes W is formed on the work function controlling metal.

5. The method of semiconductor processing according to claim 4, wherein the work function controlling metal includes TiN, and the conductor film having the cap and the resist thereon is etched by using the plasma, which is a mixed gas of SF6 gas, Cl2 gas, CHF3 gas and N2 gas.

* * * * *